(12) United States Patent
Kim et al.

(10) Patent No.: US 10,713,112 B2
(45) Date of Patent: Jul. 14, 2020

(54) MEMORY CONTROLLER HAVING MEMORY UNIT INCLUDING TABLES, MEMORY SYSTEM HAVING THE MEMORY UNIT INCLUDING THE TABLES AND OPERATING METHOD OF THE MEMORY CONTROLLER

(71) Applicant: SK hynix Inc., Gyeonggi-do (KR)

(72) Inventors: Se Hyun Kim, Seoul (KR); Jung Woo Kim, Seoul (KR); Kyung Hoon Lee, Gyeonggi-do (KR); Eun Soo Jang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 207 days.

(21) Appl. No.: 15/828,666

(22) Filed: Dec. 1, 2017

(65) Prior Publication Data

US 2018/0373586 A1 Dec. 27, 2018

(30) Foreign Application Priority Data

Jun. 21, 2017 (KR) .................. 10-2017-0078560

(51) Int. Cl.
*G06F 11/00* (2006.01)
*G06F 11/10* (2006.01)
*H03M 13/15* (2006.01)
*G11C 29/52* (2006.01)
*G11C 29/04* (2006.01)

(52) U.S. Cl.
CPC ........ *G06F 11/1004* (2013.01); *G06F 11/108* (2013.01); *G06F 11/1044* (2013.01); *G06F 11/1048* (2013.01); *H03M 13/1575* (2013.01); *G11C 29/52* (2013.01); *G11C 2029/0411* (2013.01); *H03M 13/152* (2013.01)

(58) Field of Classification Search
CPC ............ G06F 11/0793; G06F 11/1008; G06F 11/102; G06F 11/108; G06F 11/1096; G06F 11/1092; G06F 11/1088
See application file for complete search history.

(56) References Cited

U.S. PATENT DOCUMENTS

| | | | | |
|---|---|---|---|---|
| 3,699,516 A | * | 10/1972 | Mecklenburg | ........ H03M 13/05 714/788 |
| 4,679,196 A | * | 7/1987 | Tsujimoto | ........... G06F 11/1076 714/804 |
| 5,291,498 A | * | 3/1994 | Jackson | .............. G06F 11/1028 714/753 |
| 5,974,544 A | * | 10/1999 | Jeffries | ................ G06F 11/1092 710/10 |
| 8,464,093 B1 | | 6/2013 | Swenson et al. | |
| 2009/0019336 A1 | * | 1/2009 | Liao | .................... G06F 11/1008 714/755 |
| 2009/0313617 A1 | * | 12/2009 | Hung | .................. G06F 11/1092 717/168 |

(Continued)

*Primary Examiner* — Christopher S McCarthy
(74) *Attorney, Agent, or Firm* — IP & T Group LLP

(57) ABSTRACT

Disclosed is a memory controller comprising: a memory unit including tables, in which various segments are stored; a calculator configured to update a parity for the segments stored in each of the tables whenever the table is updated when a segment is currently inputted, detect an error in the table based on a previously updated parity and a currently updated parity corresponding to the table; and a bit inverter configured to correct the detected error, and an operating method therefor.

10 Claims, 11 Drawing Sheets

(56) References Cited

U.S. PATENT DOCUMENTS

| | | | |
|---|---|---|---|
| 2010/0023847 A1* | 1/2010 | Morita | G06F 11/1076 |
| | | | 714/801 |
| 2016/0004596 A1* | 1/2016 | D'Abreu | G06F 11/1072 |
| | | | 714/773 |
| 2016/0085622 A1* | 3/2016 | Andre | G06F 11/1008 |
| | | | 714/764 |
| 2017/0005672 A1 | 1/2017 | Hughes, Jr. | |
| 2019/0004700 A1* | 1/2019 | Oshinsky | G06F 3/061 |
| 2019/0227931 A1* | 7/2019 | Jung | G06F 12/0811 |

\* cited by examiner

MEMORY CONTROLLER HAVING MEMORY UNIT INCLUDING TABLES, MEMORY SYSTEM HAVING THE MEMORY UNIT INCLUDING THE TABLES AND OPERATING METHOD OF THE MEMORY CONTROLLER

CROSS-REFERENCE TO RELATED APPLICATION

The present application claims priority under 35 U.S.C. § 119(a) to Korean patent application number 10-2017-0078560 filed on Jun. 21, 2017, the entire disclosure of which is herein incorporated by reference.

BACKGROUND

Field of Invention

The present disclosure relates to a memory system capable of detecting and correcting an error of segments stored in a memory controller, and an operating method therefor.

Description of Related Art

A memory system may include a memory device and a memory controller.

The memory device may store data or output stored data. For example, the memory device may be formed as a volatile memory device in which when a supply of power is blocked, stored data disappears, or a non-volatile memory device in which even when a supply of power is blocked, stored data is maintained. The memory controller may control data communication between a host and the memory device.

The host may communicate with the memory device through the memory controller by using an interface protocol, such as Peripheral Component Interconnect—Express (PCI-E), Advanced Technology Attachment (ATA), Serial ATA (SATA), Parallel ATA (PATA), or serial attached SCSI (SCSI). The interface protocols between the host and the memory system are not limited to the foregoing example, and may include various interfaces, such as Universal Serial Bus (USB), Multi-Media Card (MMC), an Enhanced Small Disk Interface (ESDI), and Integrated Drive Electronics (IDE).

SUMMARY

The present disclosure provides a memory system which is capable of detecting and correcting an error of segments stored in a storage unit of a memory controller, and an operating method therefor.

An exemplary embodiment of the present disclosure provides a memory controller comprising: a memory unit including tables, in which various segments are stored; a calculator configured to update a parity for the segments stored in each of the tables whenever the table is updated when a segment is currently inputted, detect an error in the table based on a previously updated parity and a currently updated parity corresponding to the table; and a bit inverter configured to correct the detected error.

Another exemplary embodiment of the present disclosure provides a memory system, including: a table, in which various segments are stored; a parity storing unit, in which a parity for detecting an error of the segments are stored; a calculator configured to perform a calculation for generating the parity; a bit inverter configured to, when an error is detected in the segments, correct the detected error; and a CPU configured to control the calculator and the bit inverter so as to transmit the segments, in which the error is corrected, to a memory device.

Still another exemplary embodiment of the present disclosure provides an operating method for a memory controller including a memory unit having tables, in which various segments are stored, the method comprising: updating a parity for the segments stored in each of the tables whenever the table is updated when a segment is currently inputted; detecting an error in the table based on a previously updated parity and a currently updated parity corresponding to the table; and correcting the detected error.

According to the exemplary embodiments of the present disclosure, it is possible to detect and correct an error of segments stored in a memory controller and then transmit the segments, in which the error is corrected, to a memory device, thereby improving reliability of a memory system.

BRIEF DESCRIPTION OF THE DRAWINGS

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements or one or more intervening elements may also be present. Like reference numerals refer to like elements throughout.

DETAILED DESCRIPTION

Advantages and features of the present disclosure and methods for achieving the advantages and features will be clear with reference to exemplary embodiments described in detail below together with the accompanying drawings. However, the present disclosure is not limited to the exemplary embodiments described herein, and may be implemented in various different forms. The exemplary embodiments described herein are provided to describe the present disclosure in detail so that those skilled in the art may easily carry out the technical spirit of the present disclosure.

Throughout this specification and the claims that follow, when it is described that an element is "coupled" to another element, the element may be "directly coupled" to the other element or "electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Figure 1:
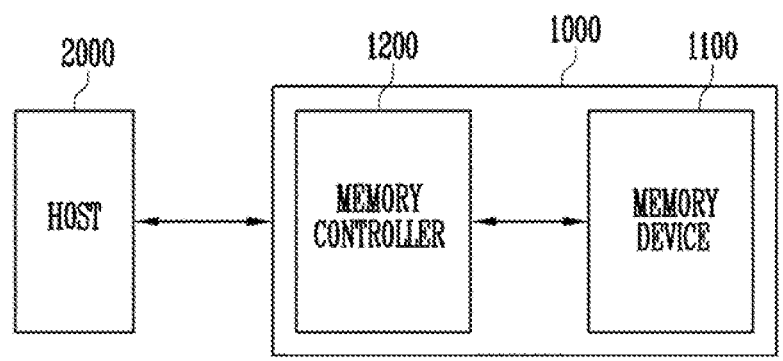
FIG. 1 is a diagram illustrating a memory system according to an exemplary embodiment of the present disclosure.

FIG. 1 is a diagram illustrating a memory system according to an exemplary embodiment of the present disclosure.

Referring to FIG. 1, the memory system 1000 may include a semiconductor memory device 1100 storing data, and a memory controller 1200 controlling the memory device 1100 under a control of a host 2000.

The host 2000 may communicate with the memory system 1000 by using an interface protocol, such as Peripheral Component Interconnect—Express (PCI-E), Advanced Technology Attachment (ATA), Serial ATA (SATA), Parallel ATA (PATA), or serial attached SCSI (SAS). Further, the interface protocols between the host 2000 and the memory system 1000 are not limited to the foregoing example, and may further include interface protocols, such as Universal Serial Bus (USB), Multi-Media Card (MMC), an Enhanced Small Disk Interface (ESDI), and Integrated Drive Electronics IDE).

The memory controller 1200 may generally control an operation of the memory system 1100, and may controls data exchange between the host 2000 and the memory device 1100. For example, the memory controller 1200 may convert received information so that a command, an address, and data may be communicated between the host 2000 and the memory device 1100, and store and output converted information. Accordingly, segments of various elements of information may be stored in the memory controller 1200. The memory controller 1200 may include a plurality of tables in which segments are stored, and when the segments are varied, a corresponding table may be updated. Accordingly, the tables may be separated into the segments. The memory controller 1200 may control the memory device 1100 by using the segments stored in the tables. For example, the memory controller 1200 may control the memory device 1100 so that program, read, or erase operations are performed.

The memory device 1100 may perform a program, read, or erase operation under the control of the memory controller 1200. Further, the memory device 1100 may receive segments from the memory controller 1200 and store the segments in a designated memory block. Depending on an exemplary embodiment, the memory device 1100 may include a Double Data Rate Synchronous Dynamic Random Access Memory (DDR SDRAM) a Low Power Double Data Rate4 (LPDDR4) SDRAM, a Graphics Double Data Rate (GDDR) SDRAM, a Low Power DDR (LPDDR), a Rambus Dynamic Random Access Memory (RDRAM), or a flash memory.

Figure 2:
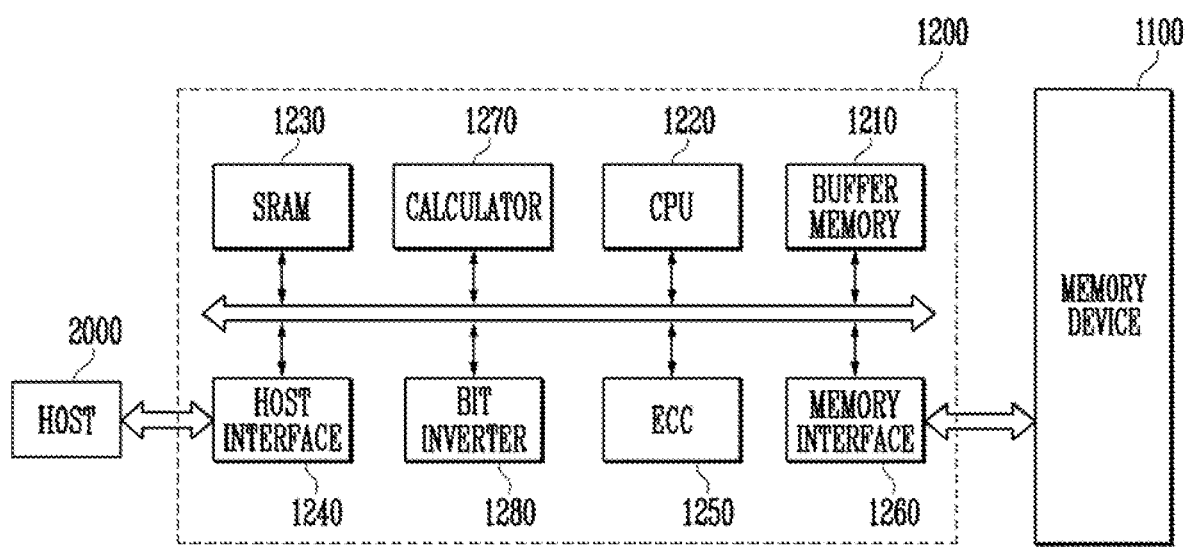
FIG. 2 is a diagram for describing a memory controller of FIG. 1 in detail.

FIG. 2 is a diagram for describing the memory controller of FIG. 1 in detail.

Referring to FIG. 2, the memory controller 1200 may include a buffer memory 1210, a CPU 1220, an SRAM 1230, a host interface 1240, an ECC 1250, a memory interface 1260 a calculator 1270, and a bit inverter 1280 for controlling communication between the host 2000 and the memory device 1100.

The buffer memory 1210 may temporarily store data while the memory controller 1200 controls the memory device 1100.

The CPU 1220 may perform various calculations for controlling the memory device 1100, and generate a command and an address. For example, the CPU 1220 may generate a state check command for a state check operation, check a status of the memory device 1100, and generate a command for controlling the memory device 1100 according to a result of the check.

The SRAM 1230 may be used as a memory unit which is capable of storing various elements of information required for an operation of the memory controller 1200. Herein, the memory unit is not limited to the SRAM, but in the description below, the present disclosure will be described based on the SRAM 1230 as an exemplary embodiment. The SRAM 1230 may include tables in which various mapping segments are stored. For example, the SRAM 1230 may include mapping information for various logical addresses and physical addresses. Further, the SRAM 1230 may detect an error of the stored segments, and store a parity used for correcting the detected error.

The host interface 1240 may include a data exchange protocol of the host 2000 connected with the memory system.

The ECC 1250 is an error correcting unit, and may detect or correct an error included in data read from the memory device 1100.

The memory interface 1260 may include a protocol for exchanging various elements of information with the memory device 1100.

The calculator 1270 may detect an error in the segments stored in the SRAM 1230. For example, the calculator 1270 may perform an XOR calculation to updated data and parity of a table in the SRAM 1230, and detect an error by comparing a previous parity before a current update with a current parity after the current update.

The bit inverter 1280 may correct the error detected by the calculator 1270 by inverting a bit at a position of the detected error.

The calculator 1270 and the bit inverter 1270 may be formed of independent devices or may be formed to be included in the CPU 1220.

Figure 3:
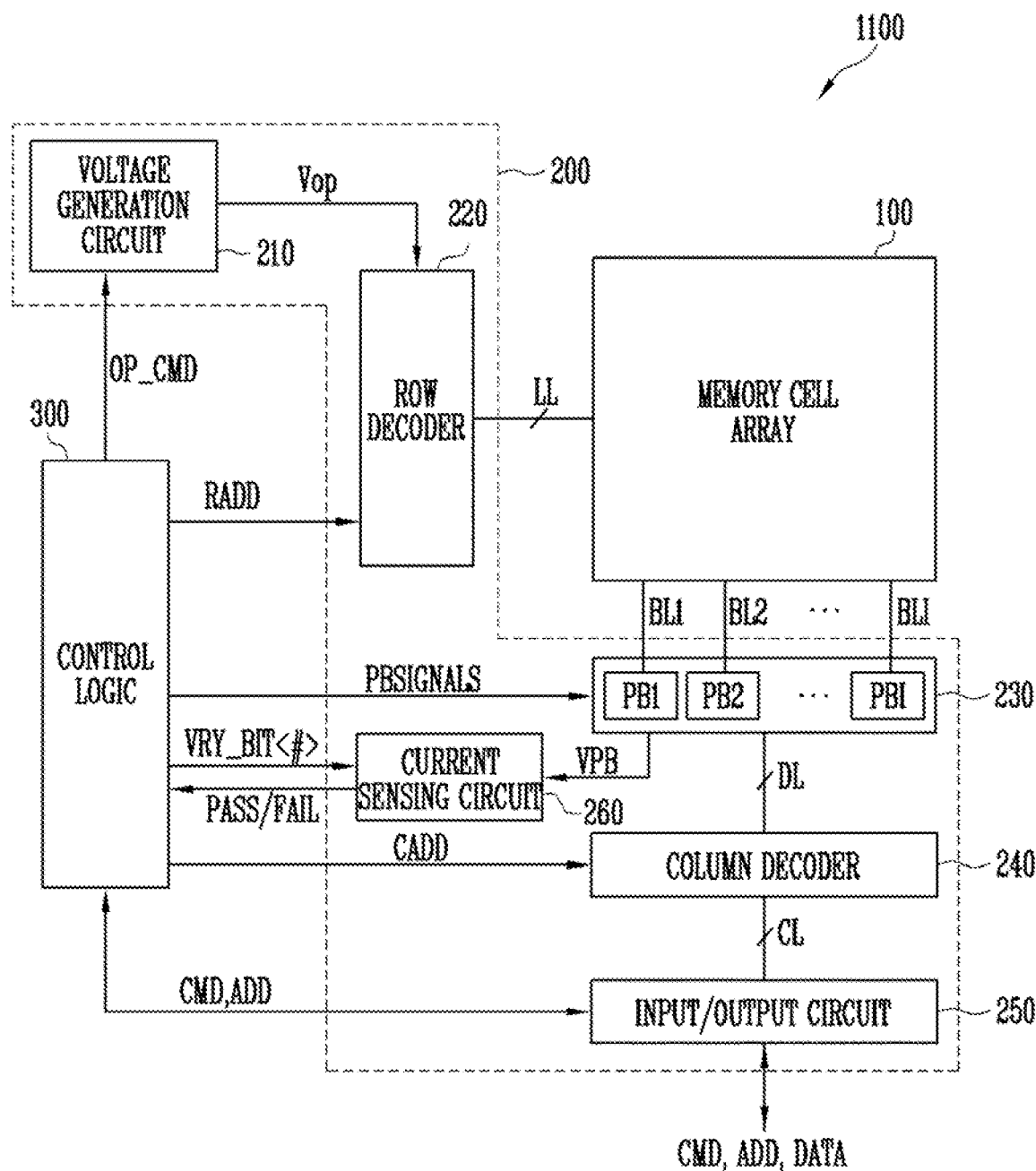
FIG. 3 is a diagram for describing a memory device of FIG. 1 in detail.

FIG. 3 is a diagram for describing the memory device of FIG. 1 in detail.

Referring to FIG. 3, the memory device 1110 may include a memory cell array 100 in which data is stored. The memory device 1110 may include peripheral circuits 200 which are configured to perform a program operation for storing data in the memory cell array 100, a read operation for outputting stored data, and an erase operation for erasing stored data. The memory device 1110 may include a control logic 300 controlling the peripheral circuits 200 according to the control of the memory controller 1200 (see FIG. 1).

The memory cell array 100 may include a plurality of memory blocks. User data and various elements of information required for the operation of the memory device 1100 may be stored in the memory blocks. The memory blocks may be formed in a two-dimensional or three-dimensional structure.

The peripheral circuits 200 may be formed so as to perform the program, read, and erase operations under the control of the control logic 300. For example, the peripheral circuits 200 may include a voltage generation circuit 210, a row decoder 220, a page buffer group 230, a column decoder, an input/output circuit 250, and a current sensing circuit 260.

The voltage generation circuit 210 may generate various operation voltages Vop used in the program, read, and erase operations in response to an operation command OP_CMD. For example, the voltage generation circuit 210 may generate a program voltage, a verification voltage, a pass voltage, a compensation program voltage, a read voltage, an erase voltage, a turn-on voltage, and the like under the control of the control logic 300.

The row decoder 220 may transmit the operation voltages Vop to local lines LL connected to a selected memory block among the memory blocks of the memory cell array 110 in response to a row address RADD. The local lines LL may include local word lines, local drain select lines, and local source select lines. In addition to this, the local lines LL may include various lines connected to the memory block, such as a source line.

The page buffer group 230 may be connected to bit lines BL1 to BLI connected to the memory blocks of the memory cell array 100. The page buffer unit 230 may include the plurality of page buffers PB1 to PBI connected to the bit lines BL1 to BLI. The page buffers PB1 to PBI may be operated in response to page buffer control signals PBSIGNALS. For example, the page buffers PB1 to PBI ay temporarily store data received through the bit lines BL1 to BLI, or may sense voltages or currents of the bit lines BL1 to BLI during a read or verify operation.

The column decoder 240 may transfer data between the input/output circuit 250 and the page buffer unit 230 in response to a column address CADD. For example, the column decoder 240 may exchange data with the page buffers PB through the data lines DL, or exchange data with the input/output circuit 250 through column lines CL.

The input/output circuit 250 may transfer a command CMD and an address ADD received from the memory controller 1120 (see FIG. 1) to the control logic 300, or exchange data DATA with the column decoder 240.

The current sensing circuit 260 may generate a reference current in response to an allowable bit VRY_BIT<#>, compare a sensing voltage VPB received from the page buffer unit 230 with a reference voltage generated by the reference current, and output a pass signal PASS or a fail signal FAIL during a read operation or a verify operation.

The control logic 300 may output an operation signal OP_CMD, the row address RADD, the page buffer control signals PBSIGNALS, and the allowable bit (VRY_BIT<#>) in response to the command CMD and the address ADD and control the peripheral circuits 200. Further, the control logic 300 may determine whether the verify operation passed or failed in response to the pass signal PASS or the fail signal FAIL.

Figure 4:
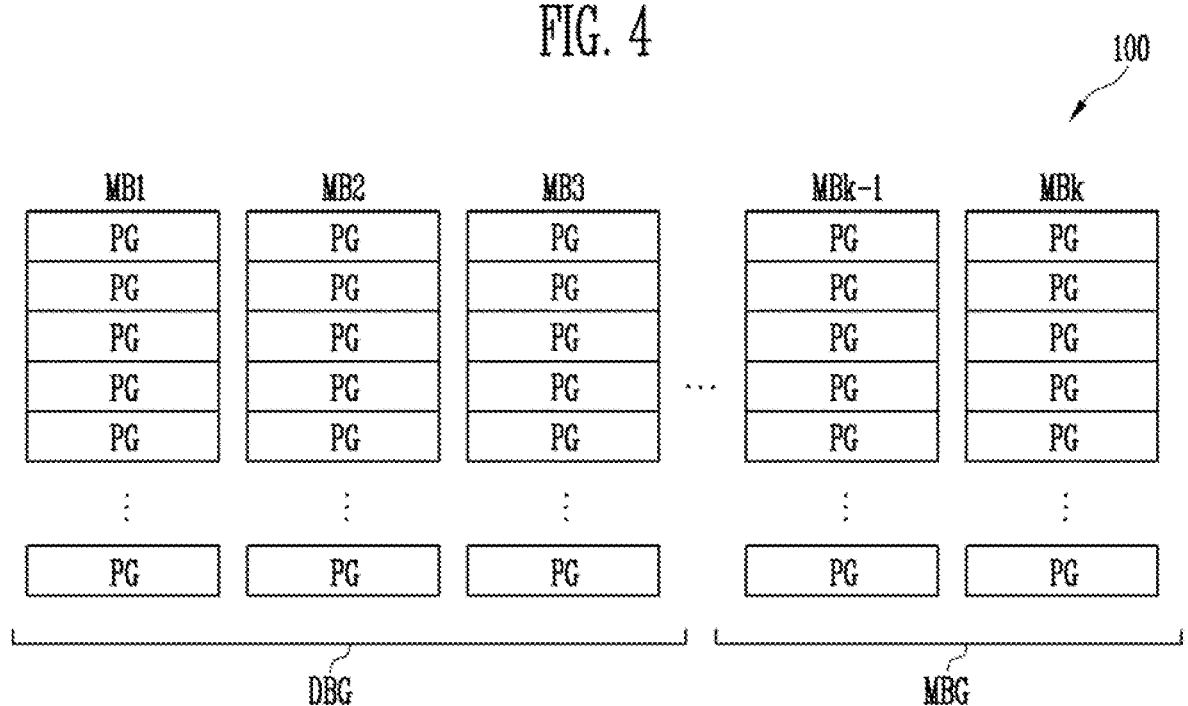
FIG. 4 is a diagram for describing a memory cell array of FIG. 3 in detail.

FIG. 4 is a diagram for describing the memory cell array of FIG. 3 in detail.

Referring to FIG. 4, the memory cell array 100 may include a plurality of memory blocks MB1 to MBk, where k is a positive integer. User data or segments related to the operation of the memory device may be stored in the memory blocks MB1 to MBk. The user data means data which a user may input/output. The segments related to the operation of the memory device may mean information received from the memory controller, for example, information stored in the table (map table). In addition to the information stored in the table (map table), various elements of information related to the operation of the memory device may be stored.

Accordingly, the memory blocks MB1 to MBk may be divided into a data block group DBG and a map block group MBG according to a usage. The user data may be stored in the memory blocks included in the data block group DBG, and the segments related to the table may be stored in the memory blocks included in the map block group MBG.

The number of memory blocks included in each of the data block group DBG and the map block group MBG may be differently set according to the memory system.

Each of the memory blocks MB1 to MBk may include a plurality of pages PG. Herein, the page PG means a group of the plurality of memory cells in which data is stored. In a flash memory device which is an example, a group of the memory cells connected to the same word line may be one page PG.

The memory blocks MB1 to MBk may be various formed, and this will be described through the exemplary embodiments of FIGS. 5 to 7 in detail.

Figure 5:
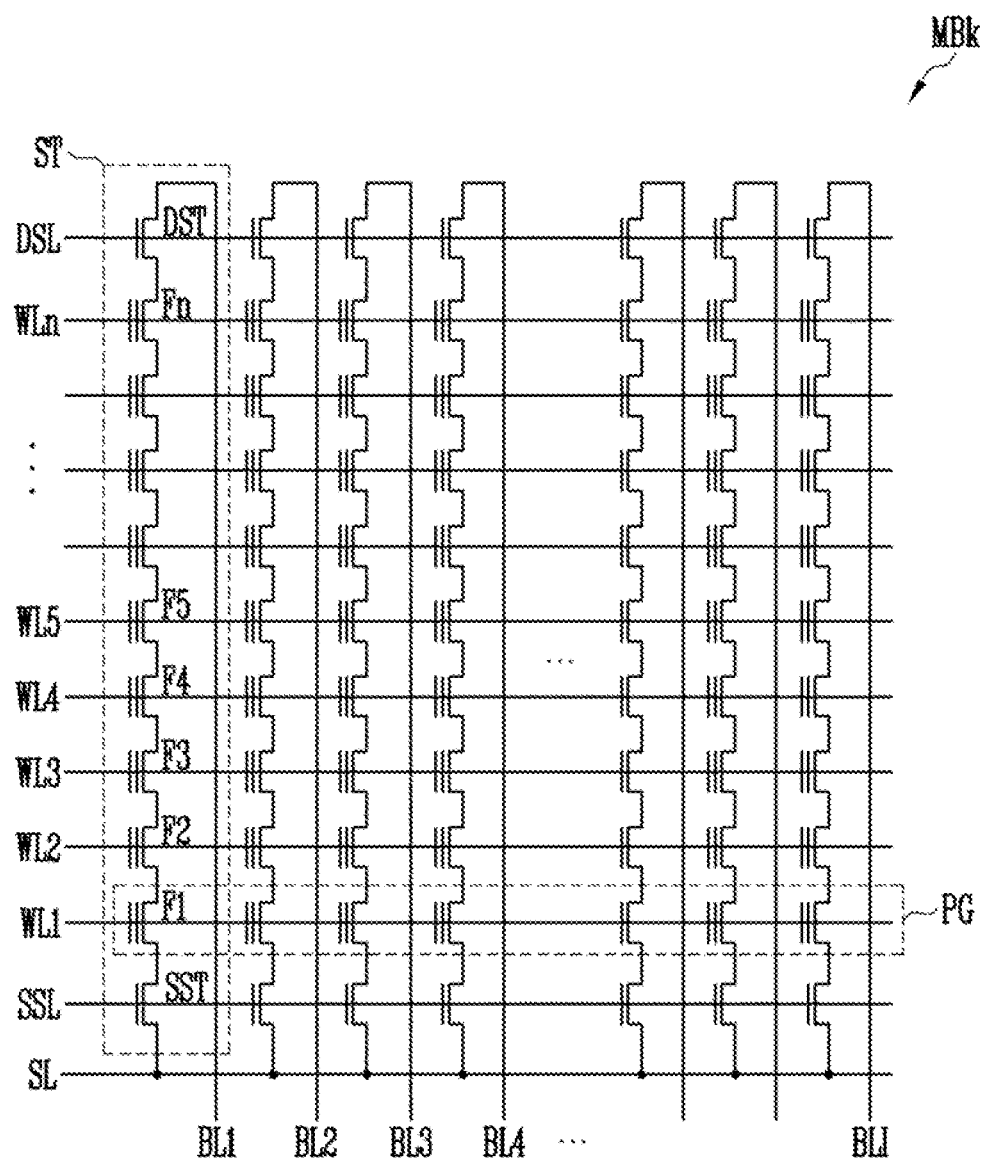
FIGS. 5 to 7 are diagrams for describing various exemplary embodiments of a memory block of FIG. 4.
Figure 6:
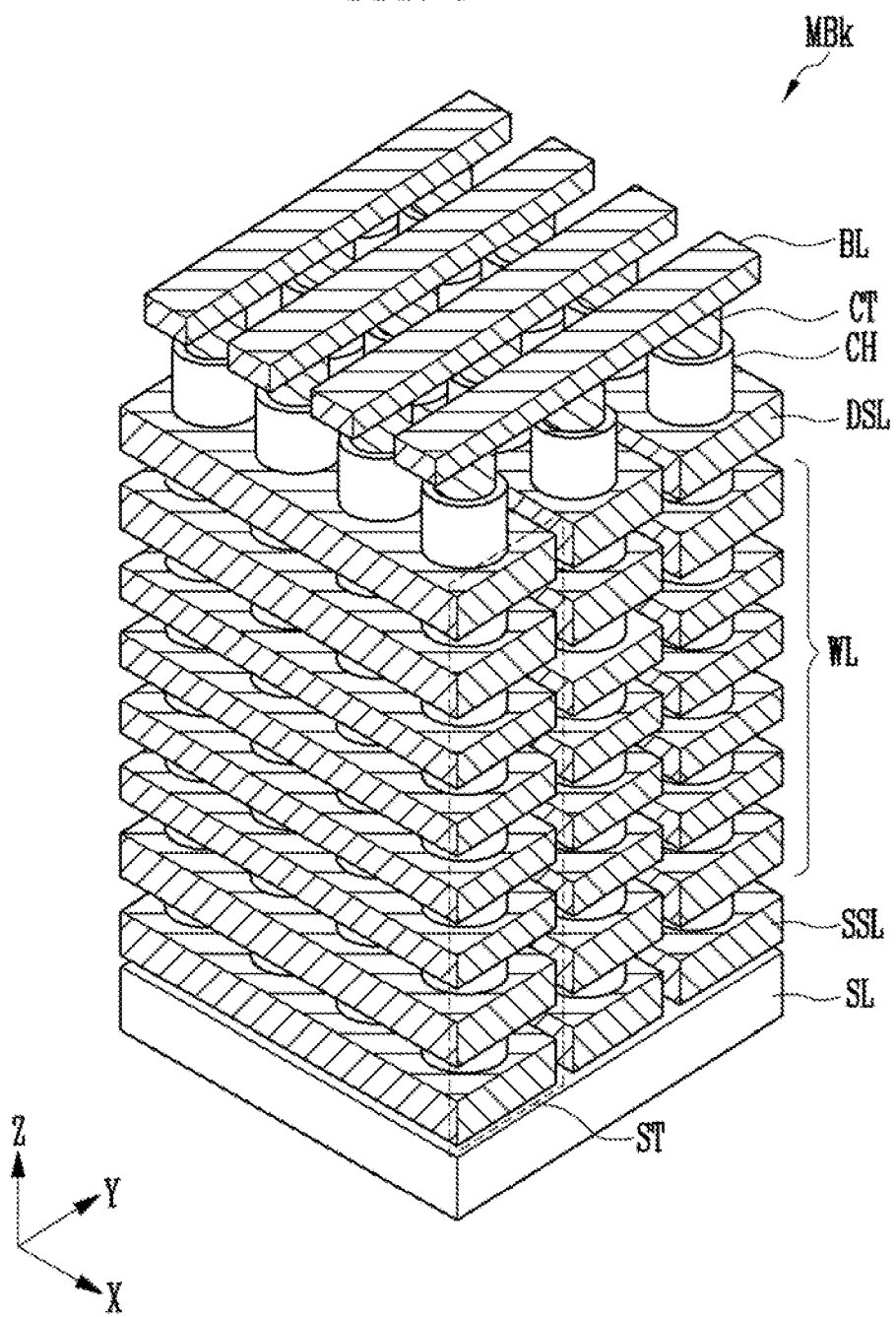
Figure 7:
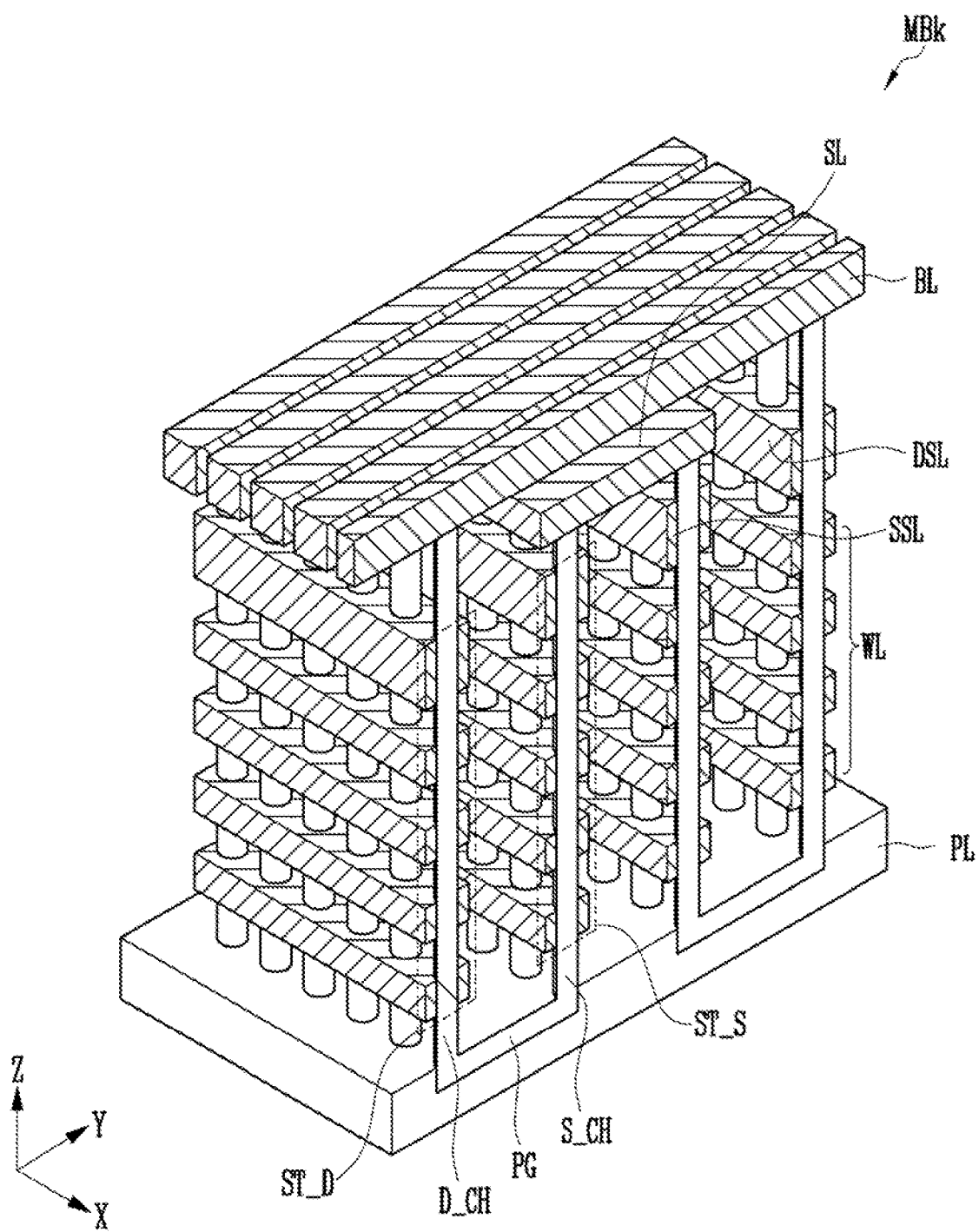

FIGS. 5 to 7 are diagrams for describing various exemplary embodiments of the memory block of FIG. 4.

Referring to FIG. 5, the memory block MBk may include a plurality of cell strings ST connected between the bit lines BL1 to BLI and a source line SL. For example, the cell strings ST may be connected to the bit lines BL1 to BLI, respectively, and may be commonly connected to the source line SL. The cell strings ST are similarly formed, so that the cell string ST connected to a first bit line BL among the cell strings ST will be described as an example.

The cell string ST may include a source select transistor SST, first to $n^{th}$ memory cells F1 to Fn, where n is a positive integer, and a drain select transistor (DST) which are serially connected between the source line SL and the first bit line BL1. The numbers of source and drain select transistors SST and DST are not limited to the numbers illustrated in FIG. 5. The source select transistor SST may be connected between the source line SL and the first memory cell F1. The first to $n^{th}$ memory cells F1 to Fn may be serially connected between the source select transistor SST and the drain select transistor DST. The drain select transistor DST may be connected between the $n^{th}$ memory cell FN and the first bit line BL1. Although not illustrated, dummy cells may also be further connected between the memory cells F1 to Fn, or between the source select transistor SST and the drain select transistor DST.

Gates of the source select transistors SST included in the different cell strings ST may be connected to the source select line SSL, gates of the first to $n^{th}$ memory cells F1 to Fn may be connected to the first to $n^{th}$ word lines WL1 to WLn, and gates of the drain select transistors DST may be connected to the drain select lines DSL. Herein, a group of the memory cells which are connected to the word lines WL1 to WLn, respectively, is referred to as a page PG. For example a group of the first memory cells F1 connected to the first word line WL among the memory cells F1 to Fn included in the different cell strings ST may be one page PG. The program and read operations may be performed in the unit of the page PG.

Referring to FIG. 6, the memory block MBK may be formed in a three-dimensional structure The memory block MBk formed in the three-dimensional structure may be formed on a substrate in a form of a vertical "I" shape, that is, in the z-axis direction and may include the plurality of cell strings ST arranged between the bit lines BL and the source line SL. Otherwise, a well may also be formed instead of the source line SL. The structure may also be called Bit Cost Scalable (BiCS). For example, when the source line SL is horizontally formed on the substrate, the cell strings ST having the BiCS structure may be formed on the source line SL in a vertical direction that is, the z-axis direction.

More particularly, the cell strings ST may be arranged in the first direction that is, an X-axis direction, and a second direction that is, a Y-axis direction. The cell strings ST may include the source select lines SSL, the word lines WL, and the drain select lines DSL which are stacked while being spaced apart from one another. The numbers of source select lines SSL, word lines WL, and drain select lines DSL are not limited to the number illustrated in the drawing, and may be different depending on the memory device 1100. The cell strings ST may include vertical channel layers CH, which vertically pass through the source select lines SSL, the word lines WL, the drain select lines DSL, and the bit lines BL which are in contact to upper parts of the vertical channel layers CH protruding from upper parts of the drain select lines DSL and are extended in the second direction that is, the Y-axis direction. The memory cells may be formed between the word lines WL and the vertical channel layers CH. A contact plug CT may also be further formed between the bit lines BL and the vertical channel layers CH.

Referring to FIG. 7, the memory block MBk may be formed in a 3D structure which is different from that of FIG. 6.

The memory block MBk formed in the 3D structure may be formed on a substrate in a form of a "U" shape in a vertical, that is, the z-axis direction, and may include source strings ST_S and drain strings ST_D which are connected between the bit lines BL and the source line SL, and make pairs. The source strings ST_S and the drain strings ST_D may be connected to each other through a pipe gate PG to form a U-shape structure. The pipe gate PG may be formed within a pipe line PL. More particularly, the source strings ST_S may be vertically formed between the source lines SL and the pipe line PL, and the drain strings ST_D may be vertically arranged between the bit lines BL and the pipe line PL. The structure may also be called Pipe-shaped Bit Cost Scalable (P-BiCS).

More particularly, the drain strings ST_D and the source strings ST_S may be arranged in the first direction, the X-axis direction, and the second direction, the Y-axis direction, and the drain strings ST_D and the source strings ST_S may be alternately arranged m the second direction, the Y-axis direction. The drain strings ST_D may include the word lines WL which are stacked while being spaced apart from one another, and a drain select line DSL, and vertical drain channel layers D_CH vertically passing through the word lines WL and the drain select line DSL. The source strings ST_S may include the word lines WL which are stacked and are spaced apart from one another, and a source select line SSL, and vertical source channel layers S_CH vertically passing through the word lines WL and the source select line SSL. The vertical drain channel layers D_CH and the vertical source channel layers S_CH may be connected with each other by the pipe gate PG within the pipe line PL. The bit lines BL may be in contact with upper parts of the vertical drain channel layers D_CH protruding from an upper part of the drain select line DSL and may be extended in the second direction, the Y-axis direction.

The memory blocks MBk may be implemented in various structures in addition to the structures described with reference to FIGS. 5 to 7.

Figure 8:
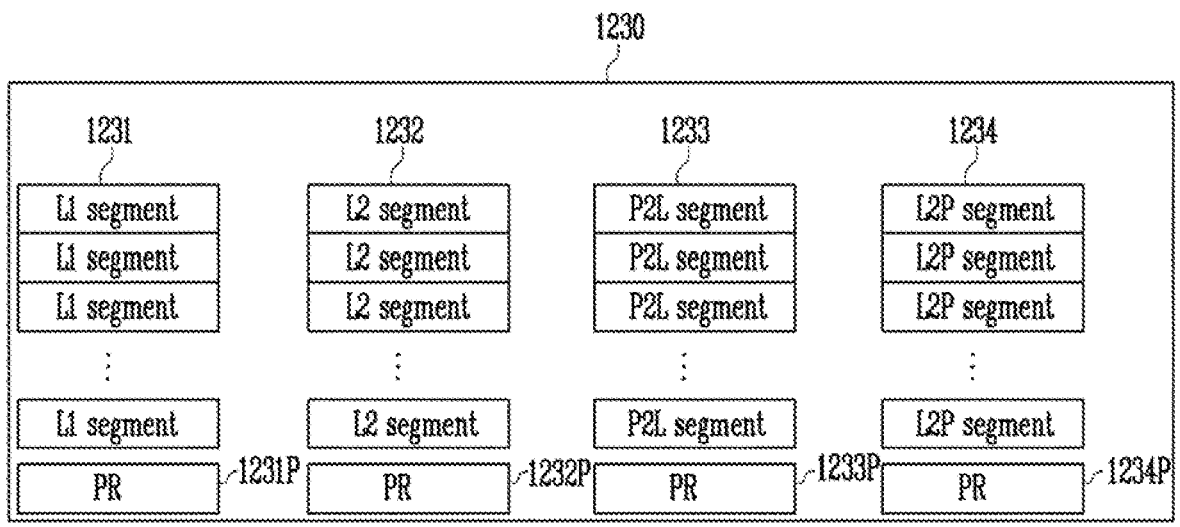
FIG. 8 is a diagram for describing map tables stored in the memory unit of the memory controller according to the exemplary embodiment of the present disclosure.

FIG. 8 is a diagram for describing tables stored in the memory unit of the memory controller 1200 according to the exemplary embodiment of the present disclosure.

Referring to FIG. 8, the memory unit of the memory controller 1200 may be exemplarily implemented with the SRAM 1230. The SRAM 1230 may include tables 1231, 1232, 1233, and 1234 in which various segments are stored. An operation of the SRAM 1230 is very fast and has very high reliability, so that important data related to the operation of the memory system may be stored in the SRAM 1230. For example the SRAM 1230 may store a first table 1231, a second table 1232, a third table 1233, and a fourth table 1234. L1 segments representing a position of a logical segment may be stored in the first table 1231. The logical segment may include data representing a position of a L2P table. L2 segments representing a position at which data is actually stored may be stored in the second table 1232. Physical/logical segments P2L segments which are physical information in which data is stored in the memory device 1100 may be stored in the third table 1233. Logical/physical segments L2P segments which are logical information requested by the host 2000 may be stored in the fourth table 1234.

Further, in the exemplary embodiment, parities for detecting and correcting an error of the segments stored in the tables may be stored in the first to fourth tables 1231 to 1234, respectively. For example, a parity PR for detecting and correcting an error of the L1 segments stored in the first table 1231 may be stored in a first parity storing unit 1231P of the first table 1231. Second to fourth parity storing units 1231P to 1234P may also be included in the remaining second to fourth tables 1232 to 1234, and a parity PR for detecting and correcting an error of the segments stored in the tables may be stored in the second to fourth parity storing units 1232P to 1234P, respectively.

The parities PR stored in the first to fourth parity storing units 1231P to 1234P may be updated whenever the L1 segments, L2 segments, P2L segments, and L2P segments stored in the first to fourth tables 1231 to 1234 are updated. For example, whenever the L1 segment stored in the first table 1231 is newly input, the parity PR stored in the first parity storing unit 1231P may be updated. The second to fourth parity storing units 1232P to 1234P may also be updated according to the segments input into the tables, respectively, or varied.

Further, sizes of the parities PR stored in the first to fourth parity storing units 1231P to 1234P may be set according to sizes of the segments stored in the tables, respectively. For example, when the L1 segment stored in the first table 1231 is 2 bytes, the parity PR stored in the first parity storing unit 1231P may also be generated to have a size of 2 bytes. For example, when the P2L segment stored in the third table 1233 is 4 bytes, the parity stored in the third parity storing unit 1233P may also be generated to have a size of 4 bytes.

A generation method for the parities PR stored in the first to fourth parity storing units 1231P to 1234P will be described based on the first table 1231 as an example below.

TABLE 1

| page 1 | L1 segment |
|---|---|
| page 2 | null |
| page 3 | null |
| ... | null |
| Page N | null |
| 1231p | null→PR1 |
| | (PR1 = page 1 XOR null) |

Referring to Table 1, when the L1 segments is input into a first page (page 1) in a state in which all of N pages of the first table 1231 are null, the calculator 1270 (see FIG. 2) may generate a first parity PR1 by calculating the L1 segments input into the first page (page 1) and an initial parity (null) stored in the first parity storing unit 1231P. The first parity PR1 may be updated into the first parity storing unit 1231P. Herein, the initial parity stored in the first parity storing unit 1231P may be differently set according to a user. For example, every initial parity may be set with "0" or "1".

TABLE 2

| page 1 | L1 segment |
|---|---|
| page 2 | L1 segment |
| page 3 | null |
| ... | null |
| page N | null |
| 1231p | PR1→PR2 |
| | (PR2 = page 2 XOR PR1) |

Referring to Table 2, when a new L1 segment is input into a second page (page 2) in a state where the L1 segment is stored in the first page (page 1) of the first table 1231, the calculator 1270 may generate a second parity PR2 by calculating the L1 segment, which is input into the second page (page 2), and the first parity PR1. The second parity PR2 may be temporarily stored inside the calculator 1270 until an error detection operation is completed. When the error detection operation is completed, the second parity PR2 may be updated into the first parity storing unit 1231P. That is, when the L1 segment is newly input into the second page (page 2), the first parity PR1 stored in the first parity storing unit 1231P may be changed to the second parity PR2 through the update of the first parity storing unit 1231P. For example, the calculator 1270 may XOR calculate the L1 segment input into the second page (page 2) and the first parity PR1, and may generate the second parity PR2 as a result of the calculation.

TABLE 3

| page 1 | L1 segment |
|---|---|
| page 2 | L1 segment |
| page 3 | L1 segment |
| ... | null |
| page N | null |
| 1231p | PR2→PR3 |
| | (PR3 = page 3 XOR PR2) |

Referring to Table 3, when a new L1 segment is input into a third page (page 3) in a state where the L1 segment is stored in the first and second pages (page 1 and page 2) of the first table 1231, the calculator 1270 may generate a third parity PR3 by calculating the L1 segment, which is input into the third page (page 3), and the second parity PR2. The third parity PR3 may be temporarily stored inside the calculator 1270 until the error detection operation is completed. When the error detection operation is completed, the third parity PR3 may be updated into the first parity storing unit 1231P. That is, when the L1 segment is newly input into the third page (page 3), the second parity PR2 stored in the first parity storing unit 1231P may be changed to the third parity PR3 through the update of the first parity storing unit 1231P. For example, the calculator 1270 may XOR calculate the L1 segment input into the third page (page 3) and the second parity PR2, and may generate the third parity PR3 as a result of the calculation.

By this method, the first parity storing unit 1231P may also be updated whenever the first table 1231 is updated.

Whenever the first parity storing unit 1231P is updated, the calculator 1270 may compare a previous parity before a current update with a current parity after the current update and detect an error of the segment stored in the memory unit according to a result of the comparison. For example, when the previous parity is the first parity PR1 and the current parity is the second parity PR2, the calculator 1270 may compare the first parity PR1 and the second parity PR2, and when an inverted bit is detected in the second parity PR2, it may be determined that the error occurs in the segments of the table, and when an inverted bit is not detected in the second parity PR2, it may be determined that the error does not occur in the segments of the table.

When the error is detected that is, when the inverted bit is detected in the current parity, a bit inverter 1280 may correct the error of the segments corresponding to the inverted bit of the current parity in the SRAM 1230. For example, the bit inverter 1280 may find the table and the page including the detected error corresponding to the inverted bit in the current parity by a parallel parity error correction method according to position information of the inverted bit in the current parity, and correct the detected error of the segments corresponding to the inverted bit in the current parity by inverting the bit of the detected error in the segments.

According to the foregoing method, in the remaining second to fourth tables 1232 to 1234, whenever the segments are updated, the parities may be updated, and an error of the updated segments may be detected and corrected by using the updated parity. When an error is not detected, the segments of the updated table may be transmitted to the memory device 1100 (see FIG. 1). When the error is detected, the segments, in which the errors are corrected according to the foregoing method, may be transmitted to the memory device 1100. As described above, the error of the segments stored in the SRAM 1230 are detected and corrected, and the segments, in which the errors are corrected, are transmitted to the memory device 1100, thereby improving reliability of an operation of the memory device 1100.

Figure 9:
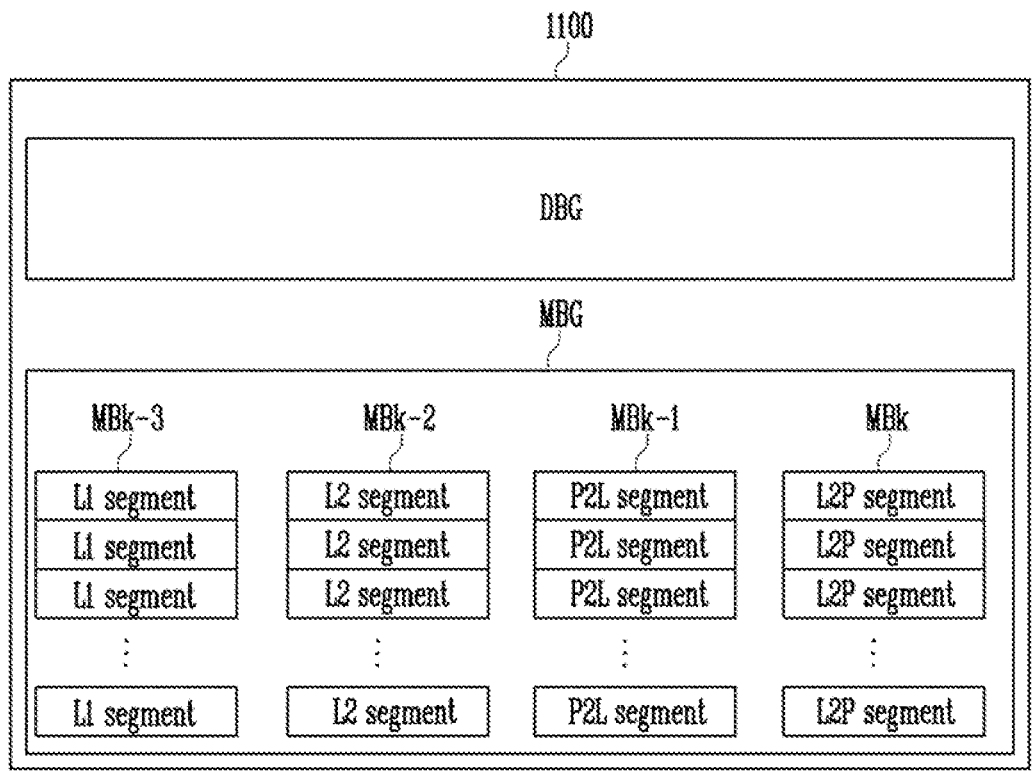
FIG. 9 is a diagram for describing segments stored in memory blocks of the memory device according to the exemplary embodiment of the present disclosure.

FIG. 9 is a diagram for describing the segments stored in the memory blocks of the memory device 1100 according to the exemplary embodiment of the present disclosure.

Referring to FIG. 9, the memory device 1100 may include the plurality of memory blocks included in each of the data block group DBG and the map block group MBG. As described above, user data may be stored in the memory blocks included in the data block group DBG, and the segments related to the table transmitted from the memory controller 1200 (see FIG. 2) may be stored in the memory blocks MBK-3 to MBK included in the map block group MBG. For example, when the segments related to the table output from the SRAM 1230 (see FIG. 8) in which the error detection and correction operation may be stored in the memory blocks MBK-3 to MBK included in the map block group MBG. For example, the L1 segments stored in the first table 1231 (see FIG. 8) of the SRAM 1230 may be stored in the k-3$^{th}$ memory block MBK-3. The L2 segments stored in the second table 1232 (see FIG. 8) of the SRAM 1230 may be stored in the k-2$^{th}$ memory block MBK-2. The P2L segments stored in the third table 1233 (see FIG. 8) of the SRAM 1230 may be stored in the k-1$^{th}$ memory block MBK-1. The L2 segments stored in the fourth table 1234 (see FIG. 8) of the SRAM 1230 may be stored in the k$^{th}$ memory block MBK.

The memory device 1100 may perform the operation, such as the program, read, erase, garbage collection, or wear leveling operation, with the segments stored in the map block group MBG under the control of the memory controller 1200.

A particular method for detecting and correcting an error of the segments stored in the SRAM 1231 by the memory device 1100 will be described below.

Figure 10:
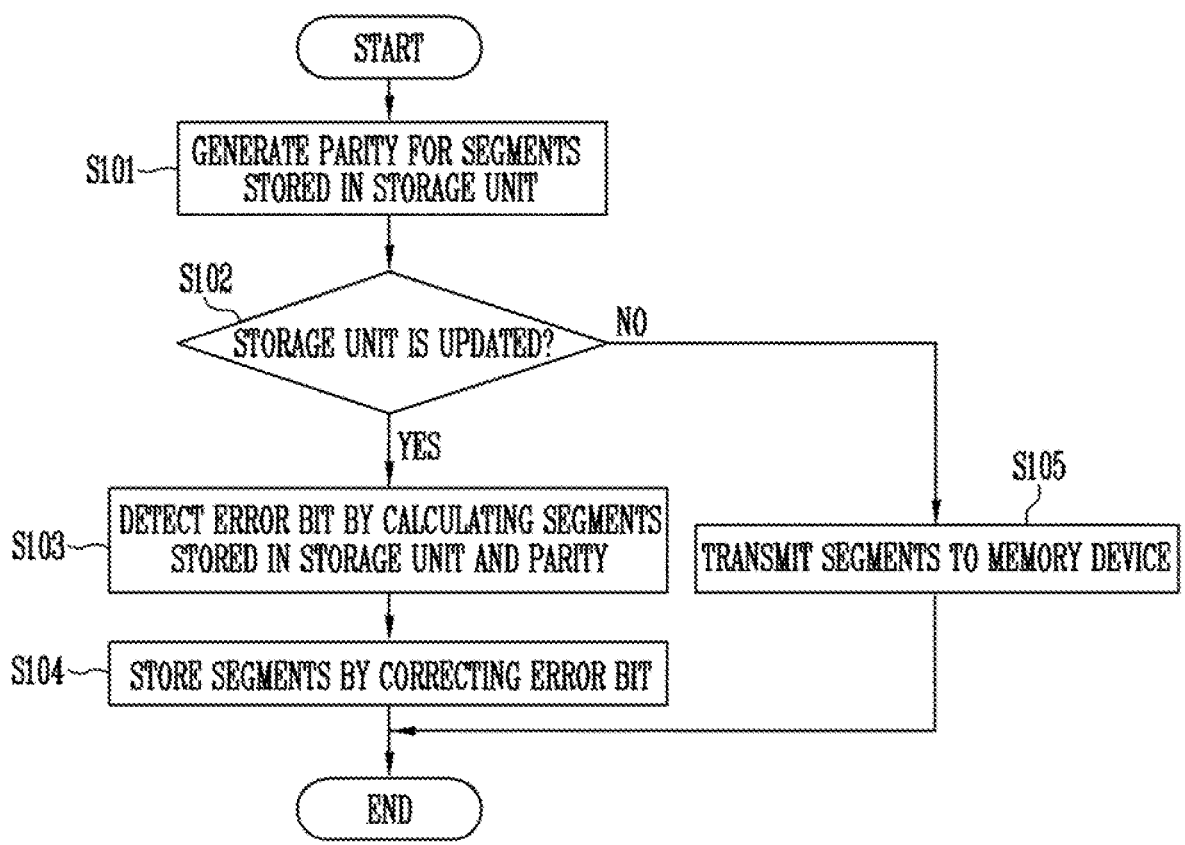
FIG. 10 is a flowchart illustrating an operating method for the memory controller according to the exemplary embodiment of the present disclosure.

FIG. 10 is a flowchart illustrating an operating method for the memory controller 1200 according to the exemplary embodiment of the present disclosure.

Referring to FIG. 10 the memory controller 1200 (see FIG. 1) may manage the table in order to process an operation in response to a request provided from the host 2000 (see FIG. 1). For example, in response to a logical address provided from the host 2000, the memory controller 1200 may store data at a location of a physical address in the memory device 1100 (see FIG. 1), and may map the logical address and the physical address in the table of the memory unit. The SRAM 1230 (see FIG. 2) may be exemplarily used as the memory unit. The method for detecting and correcting the segments stored in the memory unit will be described in detail below.

The memory controller 1200 may generate a parity PR for the segments stored in the table of the memory unit (operation S101).

The memory controller 1200 may determine whether the memory unit is updated (operation S102). For example, the memory unit may include the plurality of tables, and when a new data is received from the host (YES) a segment may be input into a table so that the memory unit may be updated. When the memory unit is not updated (NO), the memory controller 1200 may transmit the segments stored in the memory unit to the memory device 1100 (operation S105).

When it is determined that the memory unit is updated in operation S102 (YES), an error bit of the segments in the table of the memory unit may be detected by calculating the segments stored in the memory unit and the previous parity (operation S103). For example, the calculator 1270 of the memory controller 1200 may calculate the newly input segment and the previous parity generated in operation S101 and generate a current parity. When an inverted bit is detected in the current parity, the memory controller 1200 may determine that an error occurs in the segment.

When the error is detected in operation S103, the memory controller 1200 may correct an error of the segment corresponding to the inverted bit of the current parity and store the error-corrected segments again (S104). A method for correcting the error bit may be variously performed. As exemplified above, the bit inverter 1280 may find the table and the page including the detected error corresponding to the inverted bit in the current parity by a parallel parity error correction method according to position information of the inverted bit in the current parity, and correct the detected error of the segments corresponding to the inverted bit in the current parity by inverting the bit of the detected error in the segments. For another example, the memory controller 1200 may request a recovery operation to the host 2000, and the host 2000 may request again the operation related to the error of the segments in the memory unit. That is, when the error is detected in the segments newly stored in the table of the memory controller 1200 according to the operation request from the host 2000, the memory controller 1200 may remove the error of the segments by storing the corresponding segments again in response to the request provided again from the host 2000 through the request from the memory controller 1200 to the host 2000.

Subsequently, the memory controller 1200 may transmit the segments, in which the error is corrected, to the memory device 1100.

The method for detecting the error of the segments stored in the memory unit of the memory controller 1200 and correcting the detected error has been described with reference to FIG. 10. The memory controller 1200 may perform various operations based on the error correction operation. This will be described with reference to FIG. 11.

Figure 11:
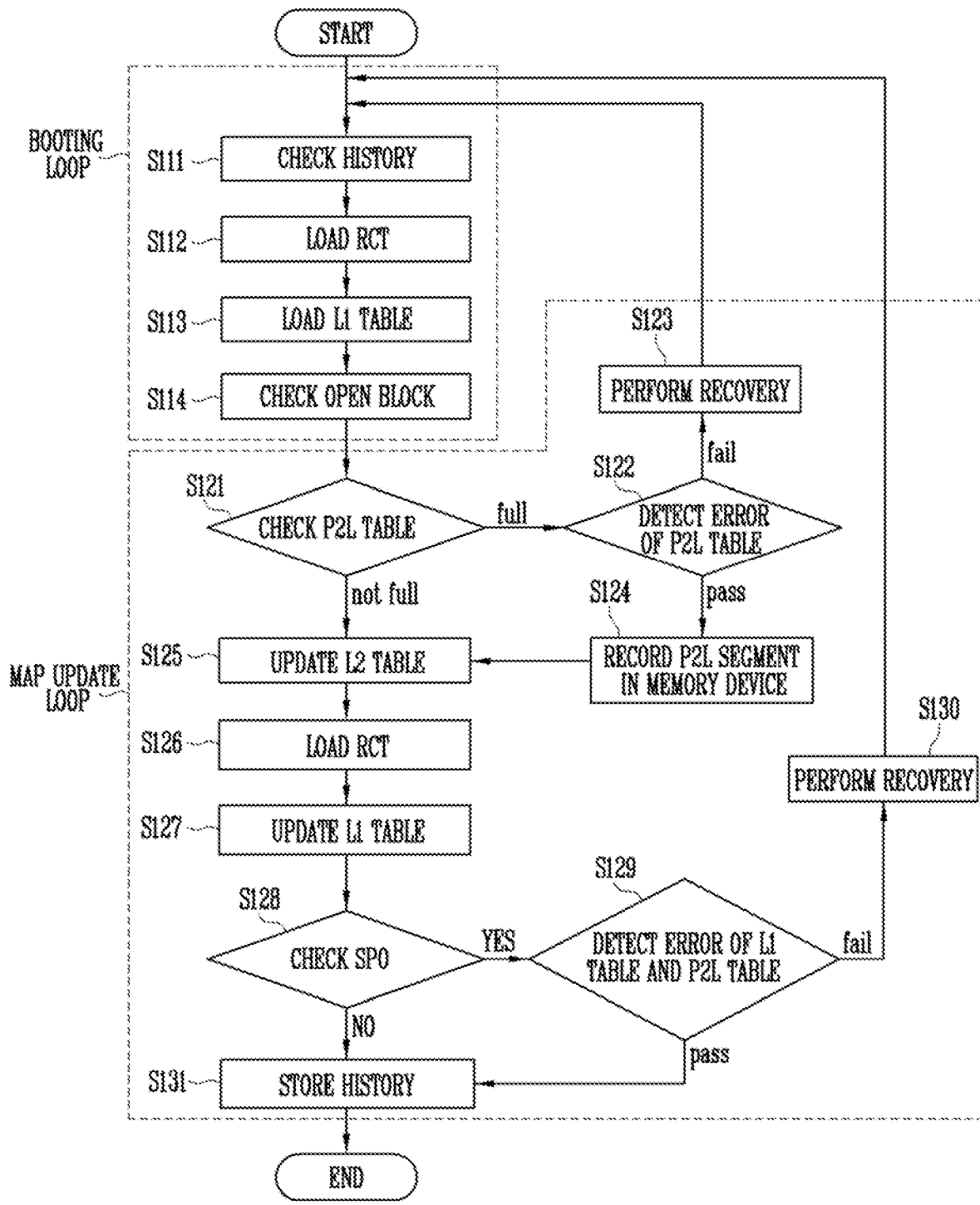
FIG. 11 is a flowchart illustrating an operating method for the memory controller according to the exemplary embodiment of the present disclosure.

FIG. 11 is a flowchart illustrating an operating method for the memory controller according to the exemplary embodiment of the present disclosure.

Referring to FIG. 11, when power of the memory system 1000 (see FIG. 1) is on, the memory system 100 may sequentially perform a booting loop and a map update loop.

In the booting loop, the memory system may check a history stored in the memory controller 1200 (operation S111) and sequentially load a read cache table RCT and the L1 table 1231 (operations S112 and S113). Herein, the history may include information related to an operation of the memory system 1000 stored before the power of the memory system 1000 is off. Recently transmitted or frequently used data may be stored in the read cache table RCT. L1 segments representing a position of a logical segment may be stored in the L1 table 1231. When the L1 table 1231 is loaded, the memory controller 1200 may check an open block of the memory device 1100 (operation S114).

When the map update loop starts, the memory controller 1200 may check the P2L table 1233 (operation S12). Physical/logical segments P2L segments that are physical information, in which data is stored in the memory device 1100, may be stored in the P2L table 1233. When there is no storage space in the P2L table (full), the memory controller 1200 may detect an error of the P2L table (operation S122). When an error is detected in the P2L table (fail), the memory controller 1200 may request a recovery operation for correcting the detected error from the host 2000 (operation S123). The error detection and recovery operation in operations S122 and S123 may be performed by the method described with reference to FIG. 10. For example, when the error is detected, the memory controller 1200 may request a recovery operation to the host 2000, and the host 2000 may request the operation to the memory controller 1200 in response to the request from the memory controller 1200. After operation S123 is performed, the booting loop may be performed again. For example, operations S111 to S123 may be repeated until an uncorrectable-error does not occur any more in the P2L table. Although not illustrated in the drawings in order to prevent operations S111 to S123 from being limitlessly repeated, when the number of times of repeat reaches the predetermined number of times, the memory controller 1200 processes the table, in which an uncorrectable-error still occurs, as a bad table.

When an uncorrectable-error is not detected in operation S122 (pass), the segments stored in the P2L table stored in the SRAM 1230 (see FIG. 2) of the memory controller 1200 may be transmitted to the memory device 1100, and the memory device 1100 may record the P2L segments in a memory block MBk-1 included in the map block group MBG (see FIG. 9) (operation S124).

When the P2L table is not full in operation S121 or operation S124 is completed, the memory controller 1200 may update the L2 table 1232. The L2 segments representing a position in which data is actually stored in the memory device 1100 may be stored in the L2 table 1232. Subsequently, the read cache table RCT may be loaded again (operation S126) and the memory controller 1200 may update the L1 table 1231 (operation S127). However, when the segments stored in the L2 table 1231 and the P2L table 1233 are not changed, even though the L1 table 1231 is updated in operation S127, the previous segments may be maintained.

Subsequently, the memory controller 1200 may check whether a sudden power off SPO record is present (operation S128). When there is no sudden power off (SPO) record (NO), the memory controller 1200 may store the history of the operation performed in the booting loop and the map update loop (operation S131).

When there is the sudden power off (SPO) record in operation S128, the memory controller 1200 may detect the error of the L1 table 1231 and the P2L table 1233 in order to improve reliability of the table (operation S129). When the error is not detected in operation S129 (PASS), the memory controller 1200 may store the history of the operation performed in the booting loop and the map update loop (operation S131).

When the error is detected in operation S129, the memory controller 1200 may request a recovery operation for correcting the error detected in the table in which the error is generated from the host 2000 (operation S130). The error detection and recovery operation in operations S129 and S130 may be performed by the method described with reference to FIG. 10. When the recovery operation is completed in operation S130, the booting loop may be performed again.

In the exemplary embodiment of FIG. 11, the method for detecting and correcting an error of the table stored in the memory unit, for example, the SRAM 1230 of the memory controller 1200 has been described, but in addition to the SRAM 1230, the method for detecting and correcting an error may be applied to various storage devices.

Figure 12:
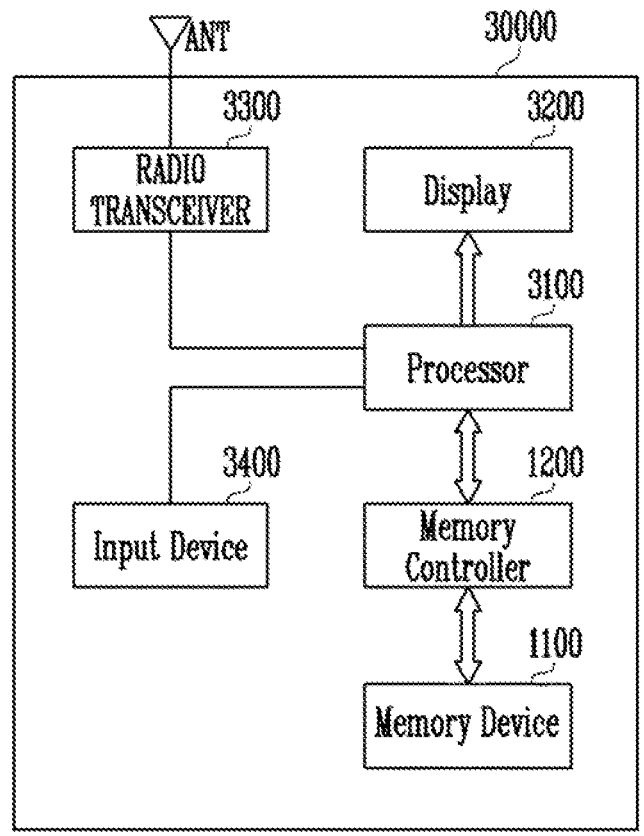
FIG. 12 is a diagram for describing another exemplary embodiment of a memory system including the memory controller illustrated in FIG. 2.

FIG. 12 is a diagram for describing another exemplary embodiment of a memory system including the memory controller illustrated in FIG. 2.

Referring to FIG. 12, a memory system 30000 may be implemented as a cellular phone, a smart phone, a tablet PC, a Personal Digital Assistant (PDA), or a wireless communication device. The memory system 30000 may include a memory device 1100 and a memory controller 1200 which is capable of controlling an operation of the memory device 1100. The memory controller 1200 may control a data access operation, for example, a program operation, an erase operation, or a read operation, of the memory device 1100 under a control of a processor 3100.

Data programmed in the memory device 1100 may be output through a display 3200 under a control of the memory controller 1200.

A radio transceiver 3300 may transceiver a wireless signal through an antenna ANT. For example, the radio transceiver 3300 may change the wireless signal received through the antenna ANT into a signal that is processible in the processor 3100. Accordingly, the processor 3100 may process a signal output from the radio transceiver 3300, and transmit the processed signal to the memory controller 1200 or the display 3200. The memory controller 1200 may transmit the signal processed by the processor 3100 to the memory device 1100. Otherwise, the radio transceiver 3300 may change a signal output from the processor 310 into a wireless signal and output the changed wireless signal to an external device through the antenna ANT. An input device 3400 is a device which is capable of inputting a control signal for controlling an operation of the processor 3100 or data to be processed by the processor 310, and may be implemented with a pointing device such as a touch pad, a computer mouse, and a keypad or a keyboard. The processor 3100 may control an operation of the display 3200 so that the data input from the memory controller 1200, the data output from the radio transceiver 3300, or the data output from the input device 3400 is output through the display 3200.

According, to the exemplary embodiment, the memory controller 1200 which is capable of controlling the operation of the memory device 1100 may be implemented with a part of the processor 3100 or be implemented with a chip separate from the processor 3100.

Figure 13:
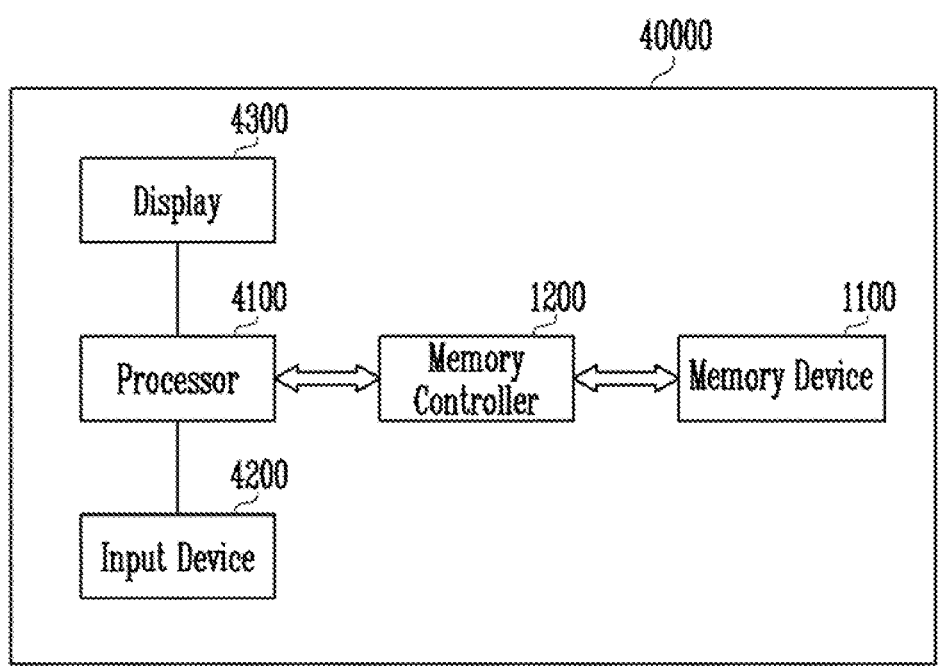
FIG. 13 is a diagram for describing another exemplary embodiment of a memory system including the memory controller illustrated in FIG. 2.

FIG. 13 is a diagram for describing another exemplary embodiment of a memory system including the memory controller illustrated in FIG. 2.

Referring to FIG. 13, memory system 40000 may be implemented as a Personal Computer (PC) a tablet PC, a net-book, an e-reader, a PDA, a Portable Multimedia Player (PMP), an MP3 player, or an MP4 player.

The memory system 40000 may include a memory device 1100 and a memory controller 1200 which is capable of controlling a data processing operation of the memory device 1100.

The processor 4100 may output data stored in the memory device 1100 according to data input through an input device 4200 through a display 4300. For example the input device 4200 may be implemented with a pointing device, such as a touch pad or a computer mouse a keypad, or a keyboard.

The processor 4100 may control a general operation of the memory system 40000 and control an operation of the memory controller 1200. According to the exemplary embodiment, the memory controller 1200 which is capable of controlling the operation of the memory device 1100 may be implemented with a part of the processor 4100 or may be implemented with a chip separate from the processor 4100.

Figure 14:
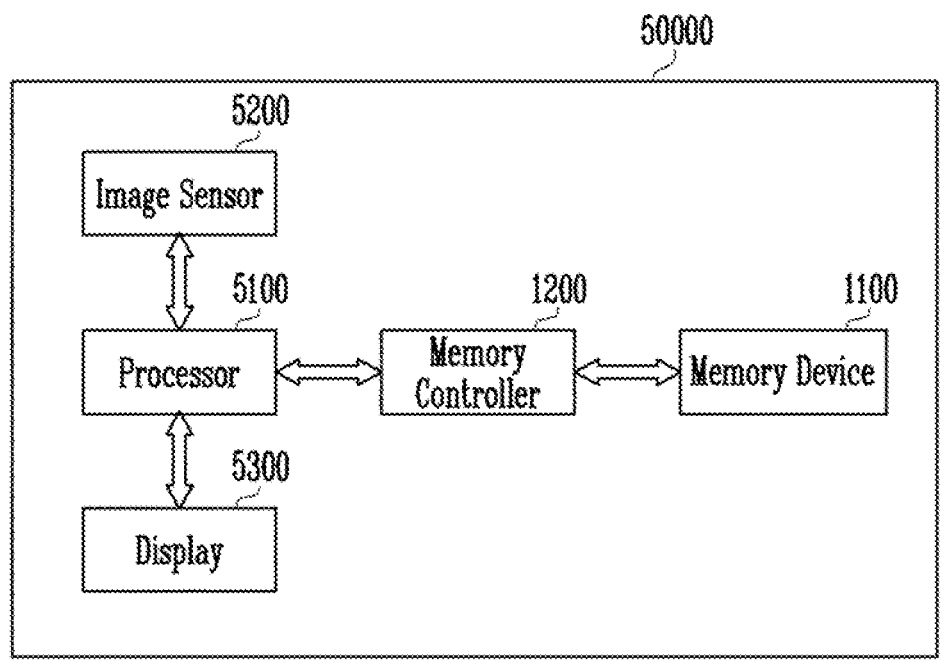
FIG. 14 is a diagram for describing another exemplary embodiment of a memory system including the memory controller illustrated in FIG. 2.

FIG. 14 is a diagram for describing another exemplary embodiment of a memory system including the memory controller illustrated in FIG. 2.

Referring to FIG. 14, a memory system 50000 may be implemented as an image processing device, for example, a digital camera, a cellular phone mounted with a digital camera, a smart phone mounted with a digital camera, or a tablet PC mounted with a digital camera.

The memory system 50000 may include a memory device 1100 and a memory controller 1200 which is capable of controlling a data processing operation, for example, a program operation, an erase operation, or a read operation, of the memory device 1100.

An image sensor 5200 of the memory system 50000 may convert an optical image into digital signals, and transmit the converted digital signals to the processor 5100 or the memory controller 1200. Under the control of the processor 5100, the converted digital signals may be output through a display 5300 or stored in the memory device 1100 through the memory controller 1200. Data stored in the memory device 1100 may be output through the display 5300 under a control of the processor 5100 or the memory controller 1200.

According to the exemplary embodiment, the memory controller 1200 which is capable of controlling the operation of the memory device 1100 may be implemented with a part of the processor 5100 or may be implemented with a chip separate from the processor 5100.

Figure 15:
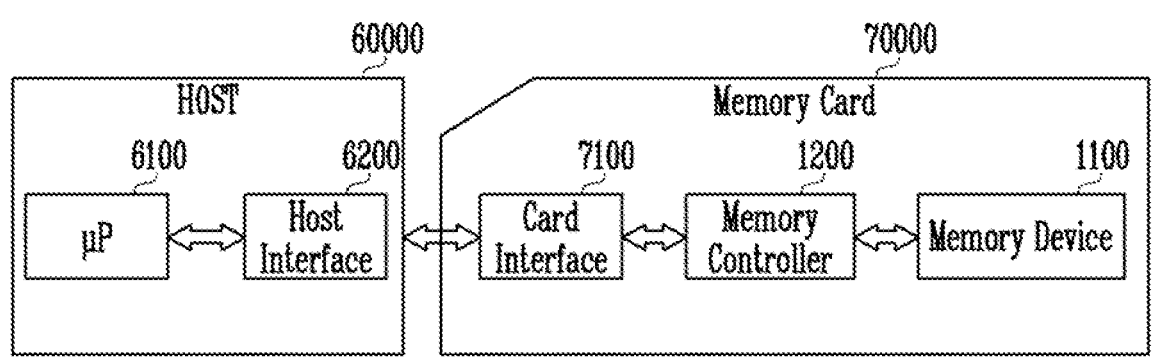
FIG. 15 is a diagram for describing another exemplary embodiment of a memory system including the memory controller illustrated in FIG. 2.

FIG. 15 is a diagram for describing another exemplary embodiment of a memory system including the memory controller illustrated in FIG. 2.

Referring to FIG. 15, a memory system 70000 may be implemented as a memory card or a smart card. The memory system 70000 may include a memory controller 1100, a memory device 1200, and a card interface 7100.

The memory controller 1200 may exchange data between the memory device 1100 and the card interface 7100. According to the exemplary embodiment, the card interface 7100 may be a Secure Digital (SD) card interface or a Multi-Media Card (MMC) interface, but is not limited thereto.

The card interface 7100 may interface data exchange between a host 60000 and the memory controller 1200 according to a protocol of the host 60000. According to the exemplary embodiment, the card interface 7100 may support a Universal Serial Bus (USB) protocol and an InterChip (IC)-USB protocol. Herein, the card interface 7100 may mean hardware which is capable of supporting a protocol used by the host 60000, software mounted in the hardware, or a signal transmitting method.

When the memory system 70000 is connected with the host interface 6200 of the host 60000, such as a PC, a tablet PC, a digital camera, a digital audio player, a cellular phone, console video game hardware, or a digital set-top box, the host interface 6200 may communicate data with the memory device 1100 through the card interface 7100 and the memory controller 1200 under the control of a microprocessor μP 6100.

The detailed description of the present disclosure includes the description of the particular exemplary embodiments, but various modification is available within the scope without departing from the scope and the technical spirit of the present disclosure. Therefore, the scope of the present disclosure shall not be limited to the exemplary embodiments described but shall be defined by the claims to be described below and the equivalents to the claims.

What is claimed is:

1. A memory controller comprising:
   a memory unit including tables, in which various segments are stored; and
   a calculator configured to update a parity for the segments stored in the tables when the segments are updated, and to detect an error in the tables based on the parity,
   wherein the memory controller requests a recovery operation to a host, and the host outputs the segments related to the error again to the memory controller in response to the request,
   wherein the memory unit includes:
   a first table in which L1 segments representing a position of a logical segment are stored;
   a second table in which L2 segments representing a position, at which data is actually stored, are stored;
   a third table in which physical/logical segments (P2L segments) that are physical information, in which data is stored in the memory device, are stored; and
   a fourth table in which logical/physical segments (L2P segments) that are logical information requested by the host are stored.

2. The memory controller of claim 1, wherein the memory unit is implemented with a Static Random Access Memory (SRAM).

3. The memory controller of claim 1,
   wherein the calculator updates the parity by an XOR operation of the parity, and
   wherein the calculator detects the error in the tables when an inverted bit is detected.

4. The memory controller of claim 3, wherein the calculator further stores an inverted bit of a detected parity into the memory unit after the operation of detecting the inverted bit.

5. A memory system, comprising:
   tables, in which various segments are stored;
   a parity storing unit, in which a parity for detecting an error of the segments are stored;
   a calculator configured to perform a calculation for generating the parity;
   a bit inverter configured to, when an error is detected in the segments, correct the detected error; and
   a CPU configured to control the calculator and the bit inverter so as to transmit the segments, in which the error is corrected, to a memory device,
   wherein the bit inverter corrects a detected error by finding a position of the error in the tables according to an inverted bit by a parallel parity error correction method, and by inverting a bit of the error.

6. The memory system of claim 5, wherein an initial value of the parity is stored in the parity storing unit.

7. The memory system of claim 6, wherein the initial value of the parity is "0" or "1".

8. The memory system of claim 5, wherein a size of the parity is determined according to a size of the segment stored in a corresponding one among the tables.

9. An operating method for a memory controller including a memory unit having tables, in which various segments are stored, the method comprising:
   updating parities of the various segments stored in the tables after segments are inputted into the tables;
   detecting an error in the tables based on the parities calculated by an XOR operation before updated segments are transferred to a memory device;
   correcting the detected error; and
   transferring the segments in which the detected error is corrected to the memory device,
   wherein the error is corrected by finding a position of the error in the tables according to the inverted bit by a parallel parity error correction method, and by inverting a bit of the error.

10. The method of claim 9, wherein an initial value of each of the parities is "0" or "1".

* * * * *